(12) United States Patent
Chang et al.

(10) Patent No.: US 7,528,438 B2
(45) Date of Patent: May 5, 2009

(54) NON-VOLATILE MEMORY INCLUDING ASSIST GATE

(75) Inventors: Ko-Hsing Chang, Hsinchu (TW); Chiu-Tsung Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 472 days.

(21) Appl. No.: 11/162,035

(22) Filed: Aug. 26, 2005

(65) Prior Publication Data
US 2006/0186459 A1 Aug. 24, 2006

(30) Foreign Application Priority Data
Feb. 24, 2005 (TW) .............. 94105555 A (51) Int. Cl.
*H01L 29/788* (2006.01)
*H01L 29/76* (2006.01)
(52) U.S. Cl. .............. 257/317; 257/319; 257/321; 257/E29.129; 257/E29.3
(58) Field of Classification Search .............. 257/317, 257/319, 321, E29.129, E29.3
See application file for complete search history.

(56) References Cited
U.S. PATENT DOCUMENTS
7,015,550 B2 * 3/2006 Sugimae et al. .............. 257/365

2007/0164345 A1 * 7/2007 Terauchi .............. 257/314

OTHER PUBLICATIONS

Article titled "A Giga-Scale Assist-Gate (AG)-And-Type Flash Memory Cell with 20-MB/s Programming Throughput for Content-Downloading Applications" jointly published by Kobayashi et al., *IEEE Journal* pp. 2.2.1-2.2.4, 2001.

* cited by examiner

*Primary Examiner*—Ngan Ngo
(74) *Attorney, Agent, or Firm*—Jianq Chyun IP Office (57) ABSTRACT

A non-volatile memory is provided. An assist gate structure is formed on a substrate such that the width at the bottom of the assist gate structure is greater than the width at the top of the assist gate structure. A floating gate is formed on one side of the assist gate structure and disposed between a word line and the substrate. The width at the bottom of the floating gate is smaller than the width at the top of the floating gate. The word line, the floating gate and the assist gate structure together form a memory unit. A tunneling dielectric layer is formed between the floating gate and the substrate. An inter-gate dielectric layer is formed between the word line, the floating gate and the assist gate structure. Source/drain regions are formed in the substrate on the respective sides of the memory unit.

8 Claims, 10 Drawing Sheets

NON-VOLATILE MEMORY INCLUDING ASSIST GATE

CROSS-REFERENCE TO RELATED APPLICATION

This application claims the priority benefit of Taiwan application serial No. 94105555, filed on Feb. 24, 2005. All disclosure of the Taiwan application is incorporated herein by reference.

BACKGROUND OF THE INVENTION

1. Field of the Invention

The present invention relates to a semiconductor device. More particularly, the present invention relates to a non-volatile memory and a manufacturing method thereof.

2. Description of the Related Art

Among the various types of non-volatile memory products, electrically erasable programmable read only memory (EEPROM) is a memory device that has been widely used inside personal computer systems and electron equipment. In the EEPROM, data can be stored, read out or erased numerous times and stored data is retained even after power is cut off.

Typically, the floating gates and the control gates of EEPROM cells are fabricated using doped polysilicon. To prevent errors in reading data from an EEPROM due to over-erasing, an additional select gate is disposed on the sidewalls of the control gate and the floating gate above the substrate to form a split-gate structure.

Figure 1:
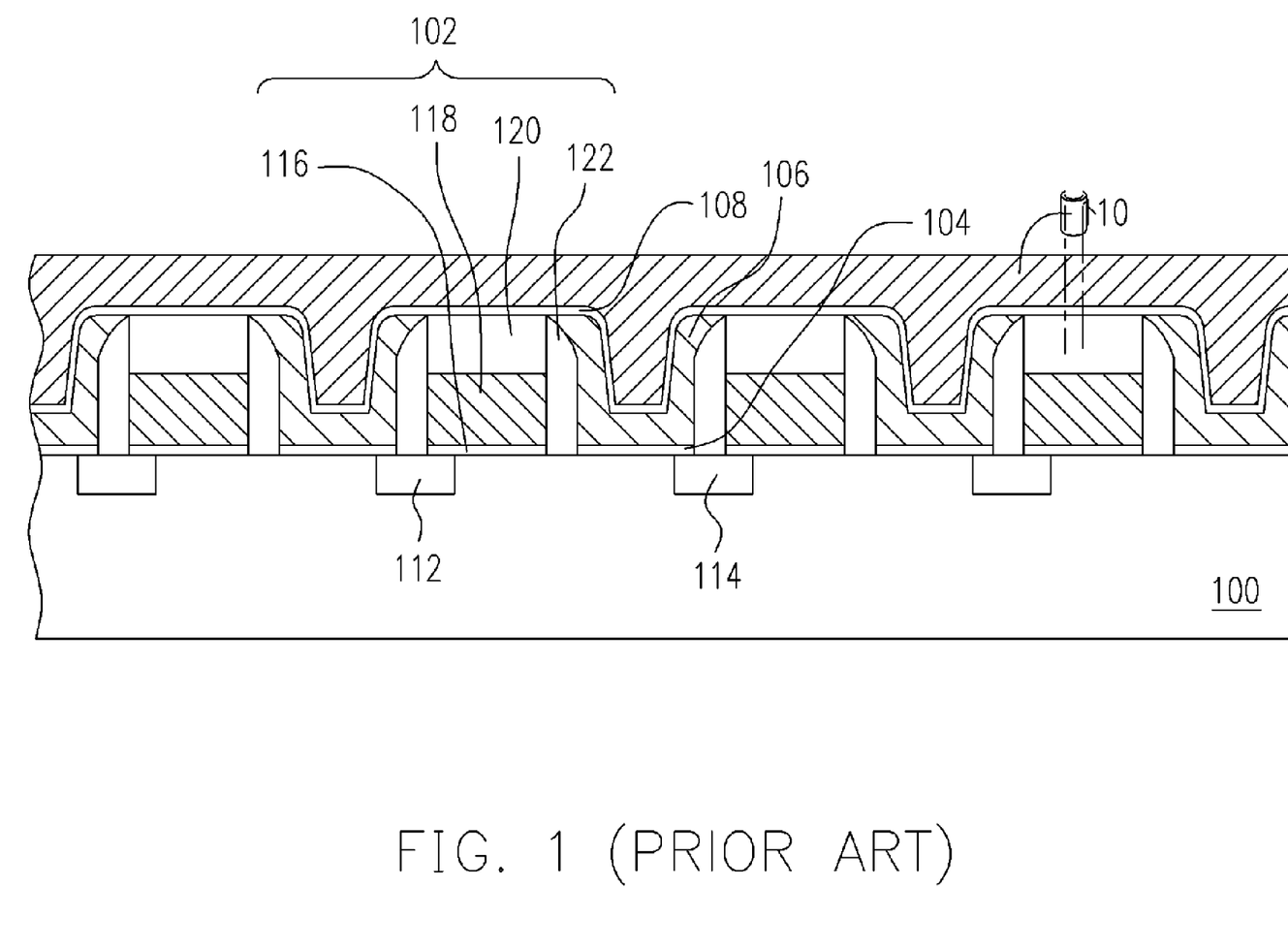
FIG. 1 is a schematic cross-sectional view of a conventional AG-AND memory structure.

At present, the manufacturing industry has successfully produced an AG-AND type memory structure composed of the split gate memory cells. FIG. 1 is a schematic cross-sectional view of a conventional AG-AND memory structure.

As shown in FIG. 1, the a single memory cell of the AG-AND memory includes a substrate 100, an assist gate structure 102, a tunneling dielectric layer 104, a floating gate 106, an inter-gate dielectric layer 108, a word line 110 (a control gate), a source/drain region 112 and another source/drain region 114. The assist gate structure 102 includes a gate dielectric layer 116, an assist gate 118, a cap layer 120 and a pair of spacers 122. In an AG-AND array, every pair of adjacent memory cells in the same row uses a common source/drain region.

As the level of integration of integrated circuits continues to increase and the dimensions of each device continues to shrink, the dimensions of the AG-AND memory cells can be reduced through a reduction in the width of the assist gate or the width of the floating gate. However, the reduction of assist gate width leads to a shorter length of the channel underneath the gate oxide layer 116. As a result, assist gate leakage between neighboring memory cells will easily occur when the memory cells are programmed and hence lead to an increase in programming disturbance. Thus, the electrical performance of the memory cells can be seriously affected. Consequently, a minimum width must be maintained for the assist gate 102.

On the other hand, the voltage needed to operate the memory cells is inversely proportional to the gate-coupling ratio (GCR) between the floating gate and the control gate. However, any reduction in the width of the floating gate will lead to a diminution of the overlapping area between the word line 110 (the control gate) and the floating gate and a reduction of the gate-coupling ratio so that voltage for operating the memory cells need to be increased. With the present trend of miniaturizing electronic devices, finding a method capable of maintaining a definite gate-coupling ratio in the memory cells and reliability in the memory devices within a limited space is an important research activity.

SUMMARY OF THE INVENTION

Accordingly, at least one objective of the present invention is to provide a non-volatile memory and manufacturing method thereof capable of providing a definite gate-coupling ratio and device reliability for the memory cells therein.

At least a second objective of the present invention is to provide a non-volatile memory and manufacturing method thereof capable of reducing the dimension of the memory cells therein and increasing the level of device integration.

At least a third objective of the present invention is to provide a non-volatile memory and manufacturing method thereof having a simpler fabrication process so that the production cost is reduced.

To achieve these and other advantages and in accordance with the purpose of the invention, as embodied and broadly described herein, the invention provides a non-volatile memory. The non-volatile memory mainly includes a substrate, an assist gate, a gate dielectric layer, a word line, a floating gate, a tunneling dielectric layer, an inter-gate dielectric layer and source/drain regions. The assist gate structure is formed on the substrate. The bottom portion of the assist gate has a first width and the top portion of the assist gate has a second width such that the first width is greater than the second width. The gate dielectric layer is formed between the assist gate and the substrate. The word line is formed on the substrate. The floating gate is formed on one side of the assist gate structure and disposed between the word line and the substrate. The bottom portion of the floating gate has a third width and the top portion of the floating gate has a fourth width such that the fourth width is greater than the third width. The assist gate, the floating gate and the word line together form a memory unit. The tunneling dielectric layer is formed between the floating gate and the substrate. The inter-gate dielectric layer is formed between the word line and the floating gate, the word line and the assist gate and the assist gate and the floating gate. The source/drain regions are formed in the substrate on the sides of the memory unit respectively.

In the aforementioned non-volatile memory, the top portion of the floating gate is higher than the top portion of the assist gate and the top portion of the floating gate also has sharp corners. Furthermore, the non-volatile memory also has a cap layer formed between the assist gate and the word line. The first width at the bottom of the assist gate is greater than the third width at the bottom of the floating gate.

The present invention also provides an alternative non-volatile memory including a substrate, a plurality of assist gates, a plurality of gate dielectric layers, a plurality of word lines, a plurality of floating gates, a plurality of tunneling dielectric layer, a plurality of inter-gate dielectric layers and a plurality of source/drain regions. The assist gates are formed in parallel on the substrate. The bottom portion of each assist gate has a first width and the top portion of each assist gate has a second width such that the first width is greater than the second width. The gate dielectric layers are formed between the assist gates and the substrate. The word lines are formed in parallel on the substrate to cross over the assist gates. The floating gates are formed between the assist gates and located between the word lines and the substrate. The bottom portion of each floating gate has a third width and the top portion of each floating gate has a fourth width such that the fourth width is greater than the third width. The tunneling dielectric layers are formed between the floating gates and the substrate. The inter-gate dielectric layers are formed between the word lines and the floating gates, the word lines and the assist gates and the assist gates and the floating gates. The source/drain regions are formed in the substrate on one side of the assist gates.

In the aforementioned non-volatile memory, the top portion of the floating gates are higher than the top portion of the assist gates and the top portion of the floating gates also has sharp corners. Furthermore, the non-volatile memory also has cap layers formed between the assist gates and the word lines. The first width at the bottom of the assist gates is greater than the third width at the bottom of the floating gates.

In the present invention, the bottom portion of the assist gate in the non-volatile memory has a larger width so that the channel underneath the assist gate is longer. As a result, disturbance between adjacent memory cells during programming can be minimized. On the other hand, the width at the top portion of the floating gate is greater than the width bottom portion of the floating gate. Hence, the overlapping area between the word line and the floating gate and hence the gate-coupling ratio is increased so that the voltage needed to operate the memory cells is reduced.

Furthermore, the width at the bottom portion of the assist gates is increased while the width at the top is reduced and the width at the bottom portion of the floating gates is reduced while the width at the top is increased in the non-volatile memory of the present invention. Hence, the memory cells can have greater better device reliability and performance and a higher operating speed without having to change the dimension of the memory cells.

In addition, the top portion of the floating gates are higher than the top portion of the assist gates and the top portion of the floating gates have sharp corners in the non-volatile memory of the present invention. Therefore, the time required to erase data from the memory in an erasing operation can be shortened and the voltage applied to the word lines can be reduced.

The present invention also provides a method of fabricating a non-volatile memory. First, a gate dielectric layer, a first conductive layer and a cap layer are sequentially are formed on a substrate. Then, the cap layer, the first conductive layer and the gate dielectric layer are patterned to from a plurality of assist gate structures. There is a gap between every pair of adjacent assist gate structure. The bottom portion of each assist gate structure has a first width and the top portion of each assist gate structure has a second width such that the first width is greater than the second width. Thereafter, a plurality of source/drain regions is formed in the substrate on one side of the assist gate structures. A tunneling dielectric layer and a first inter-gate dielectric layer are formed over the substrate. After that, a plurality of second conductive layers is formed in the gap between every pair of adjacent assist gate structures. The bottom portion of each second conductive layer has a third width and the top portion of each second conductive layer has a fourth width such that the fourth width is greater than the third width. A portion of the cap layer is removed so that the top surface of the cap layer is below the top surface of the second conductive layers. Hence, a plurality of openings is formed between the second conductive layers. A second inter-gate-dielectric layer is formed over the substrate and then a third conductive layer is formed over the substrate. The third conductive layer completely fills the openings. Thereafter, the third conductive layer and the second conductive layer are patterned to form a plurality of word lines and a plurality of floating gates.

In the aforementioned method of fabricating the non-volatile memory, the top portion of the floating gates are higher than the top portion of the assist gate structures and the top portion of the floating gates also has sharp corners. Furthermore, the method of forming the source/drain regions on one side of the assist gates includes performing a tilted ion implantation.

In the aforementioned method of fabricating the non-volatile memory, the method of forming the second conductive layers in the gaps between every pair of adjacent assist gate structures includes depositing conductive material over the substrate and removing the conductive material outside the gaps until the cap layer is exposed. The method of removing the conductive material outside the gaps until the cap layer is exposed includes performing a chemical-mechanical polishing.

In the aforementioned method of fabricating the non-volatile memory, the method of removing a portion of the cap layer so that the top surface of the cap layer is below the second conductive layers includes performing a wet etching operation or a dry etching operation. The method of forming the tunneling dielectric layer and the first inter-gate dielectric layer over the substrate includes performing a chemical vapor deposition process.

In the aforementioned method of fabricating the non-volatile memory, the tunneling dielectric layer and the inter-gate dielectric layer are fabricated using silicon oxide. The second inter-gate dielectric layer is fabricated using silicon oxide and the cap layer is fabricated using silicon nitride.

In the aforementioned method of fabricating non-volatile memory, the floating gates and the word lines are formed in the same process. Hence, the processing method is very much simplified. Furthermore, because the bottom width of the assist gate is greater than the top width, the channels underneath the assist gates are longer. Thus, disturbance between adjacent memory cells during a programming operation is minimized. In addition, the method of forming the floating gates having a wider top portion than the bottom portion through the process of filling the gaps between adjacent assist gate structures can increase the area of overlap between the word line (the control gate) and the floating gate. Hence, the gate-coupling ratio in the memory cells is increased and the voltage needed to operate the memory cells is reduced.

Therefore, the method of fabricating the non-volatile memory according to the present invention can increase the reliability and operating speed and improve the performance of the memory cells without increasing the dimension of each memory cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
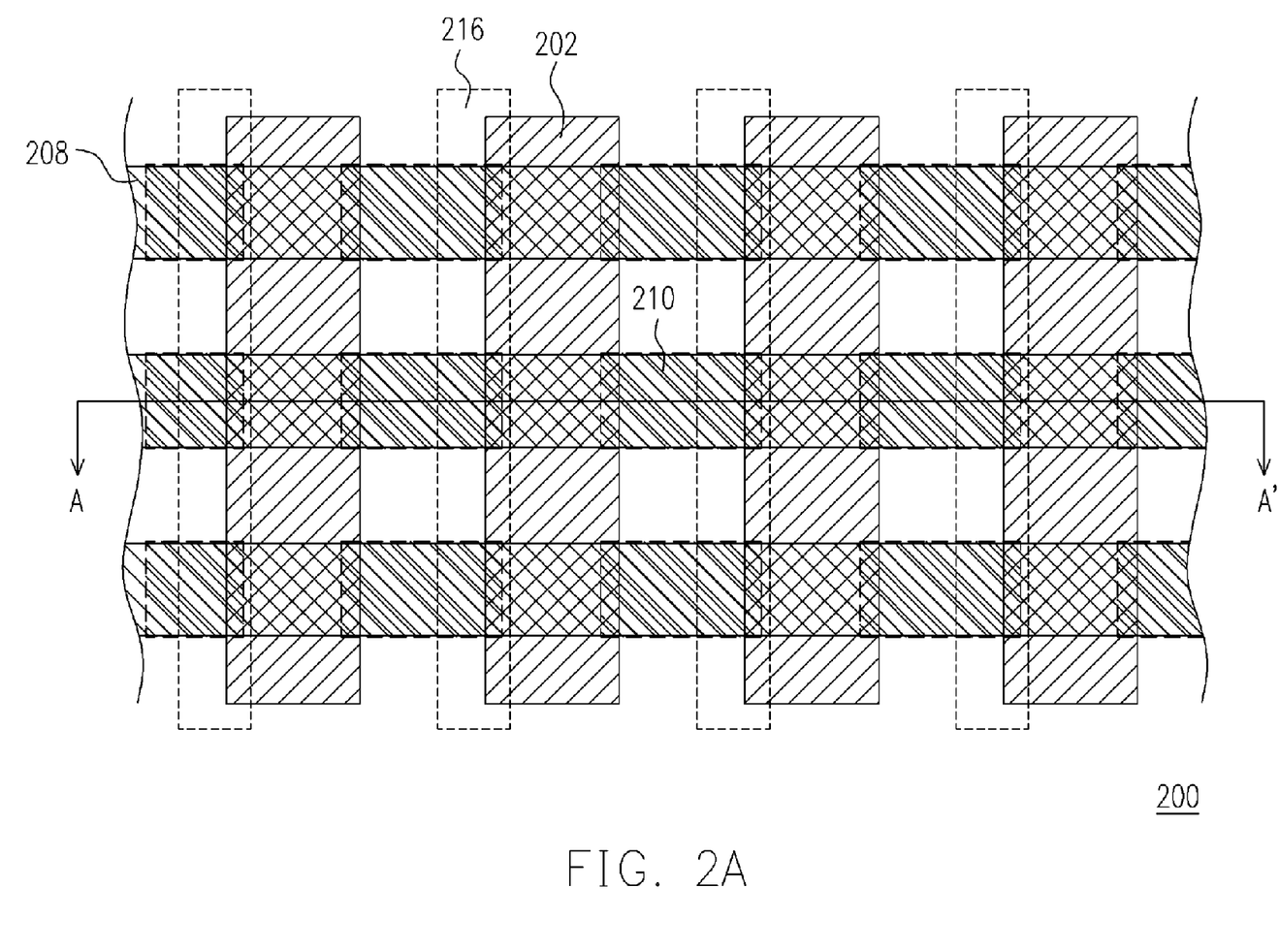
FIG. 2A is a top view of a non-volatile memory according to the present invention.
Figure 2B:
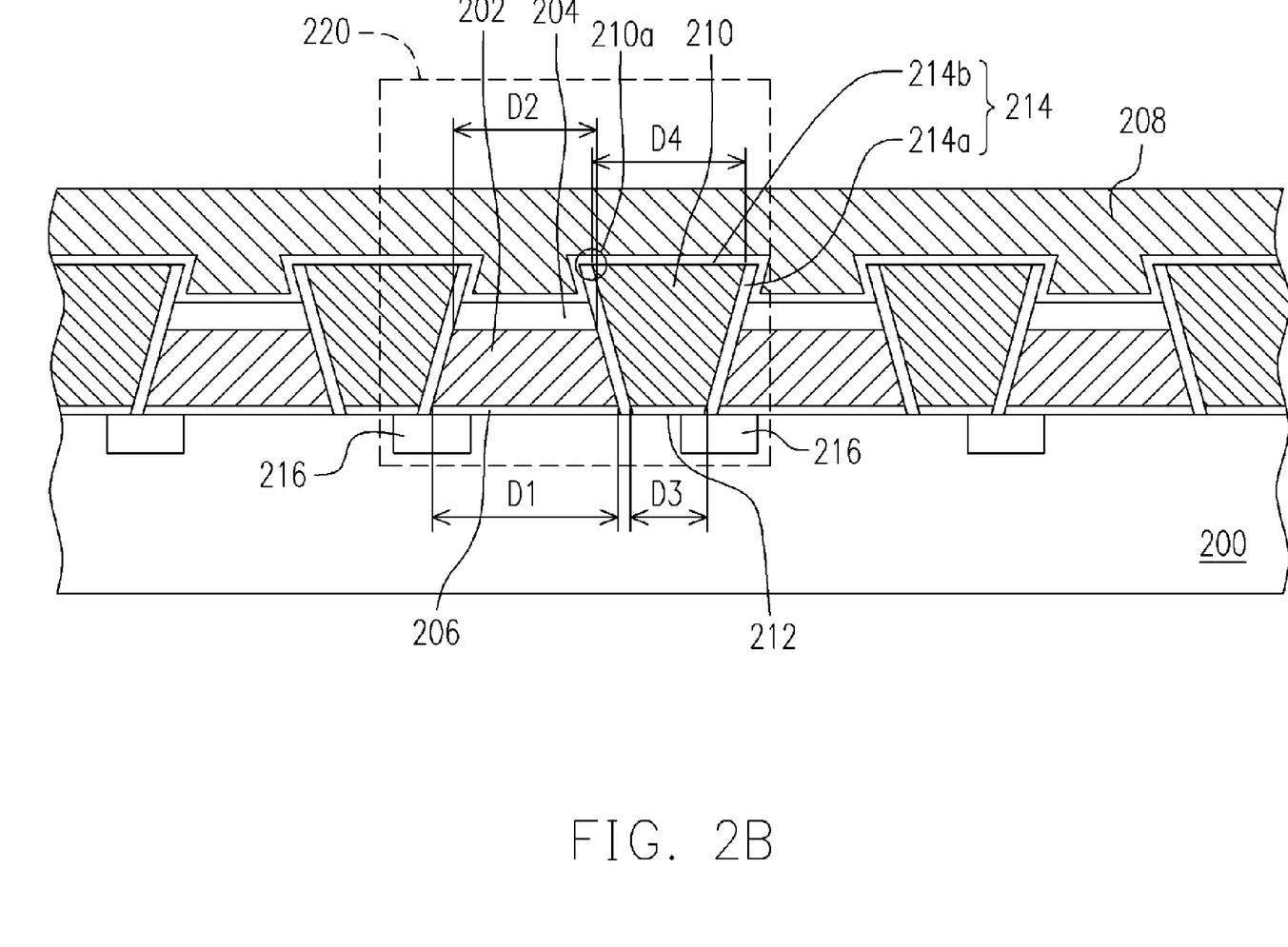
FIG. 2B is a cross-sectional view along line A-A' of FIG. 2A.
Figure 2C:
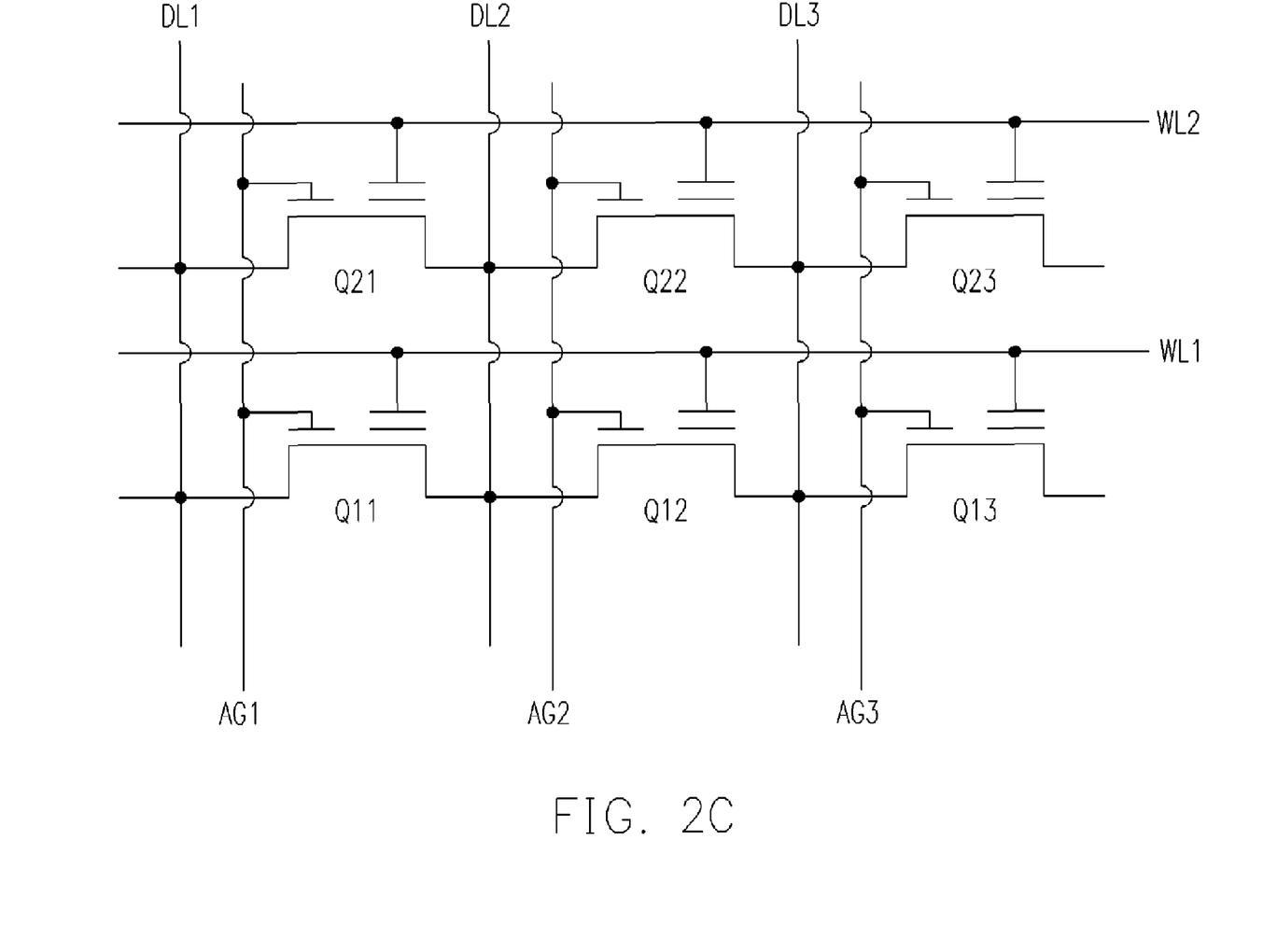
FIG. 2C is a simplified circuit diagram of the non-volatile memory according to the present invention.

FIG. 2A is a top view of a non-volatile memory according to the present invention. FIG. 2B is a cross-sectional view along line A-A' of FIG. 2A. FIG. 2C is a simplified circuit diagram of the non-volatile memory according to the present invention.

As shown in FIGS. 2A and 2B, the non-volatile memory of the present invention includes a substrate 200, a plurality of assist gates 202, a plurality of cap layers 204, a plurality of gate dielectric layers 206, a plurality of word lines 208, a plurality of floating gates 210, a plurality of tunneling dielectric layers 212, a plurality of inter-gate dielectric layers 214 (each including an inter-gate dielectric layer 214a and an inter-gate dielectric layer 214b) and a plurality of source/drain regions 216.

The assist gates 202 are aligned in parallel on the substrate 200, for example. The bottom of each assist gate 202 has a width D1 and the top of each assist gate 202 has a width D2 such that the width D1 is greater than the width D2. Therefore, the assist gate 202 has a cross-section shaped like a trapezium. The assist gates 202 are fabricated using a conductive material, for example, doped polysilicon.

The cap layer 204 is formed between the assist gates 202 and the word lines 208. The cap layer 204 is fabricated using silicon nitride, for example.

The gate dielectric layers 206 are formed between the assist gates 202 and the substrate 200. The gate dielectric layer 206 having a thickness of about 80 Å is fabricated using silicon oxide, for example.

The word lines 208 are aligned in parallel on the substrate 100. Furthermore, the word lines 208 cross over the assist gates 202. The word lines 208 are fabricated using a conductive material such as doped polysilicon, for example.

The floating gates 210 are formed between the assist gates 202 and located between the word lines 208 and the substrate 200. The bottom of the floating gate 210 has a width D3 and the top of the floating gate 210 has a width D4 such that the width D4 is greater than the width D3. Therefore, the floating gate 210 has a cross-section shaped like an inverted trapezium. Furthermore, the top of the floating gates 210 are higher than the top of the assist gates 202 and the top of the floating gates 210 also has sharp corners 210a. Because the floating gates 210 has sharp corners 210a, a high electric field is produced. Therefore, the time required to erase data from the non-volatile memory is shortened and the voltage applied to the word lines 208 can be reduced. The floating gates 210 are fabricated using a conductive material such as doped polysilicon, for example. In addition, the width D1 at the bottom of the assist gates 202 is greater than the width D3 at the bottom of the floating gate 210.

The tunneling dielectric layer 212 is formed between the floating gates 210 and the substrate 200. The tunneling dielectric layer 212 having a thickness of about 60 Å is fabricated using silicon oxide, for example.

Each inter-gate dielectric layer 214 includes an inter-gate dielectric layer 214a and an inter-gate dielectric layer 214b, for example. The inter-gate dielectric layers 214a are formed between the assist gates 202 and the floating gates 210. The inter-gate dielectric layers 214b are formed between the word lines 208 and the floating gates 210 and between the word lines 208 and the assist gates 202. The inter-gate dielectric layer 214 is fabricated using silicon oxide, for example.

The source/drain regions are formed in the substrate 200 on one side of the assist gates 206.

In the aforementioned non-volatile memory, an assist gate 202, a floating gate 210 and a control gate (a word line 208) together form a memory unit 220. The floating gate 210 is formed on one side of the assist gate 202 and located between the word line 208 and the substrate 200, for example. The source/drain regions 216 are formed in the substrate 200 on the sides of the memory unit 220 respectively.

In the aforementioned non-volatile memory, the width D1 at the bottom of each assist gate 202 is greater than the width D2 at the top and the width D4 at the top of the each floating gate 210 is greater than the width D3 at the bottom. The bottom width D1 of the assist gates 202 is larger so that the channel underneath the assist gates 202 is longer. Hence, disturbance between adjacent memory cells during a programming operation is minimized. On the other hand, the top width D4 of the floating gate 210 is greater than the bottom width D3. Therefore, the overlapping area between the word lines 208 (the control gate) and their corresponding floating gates 210 are increased so that the gate-coupling ratio of each memory cell is increased. As a result, the voltage for operating the memory cells can be reduced.

Furthermore, in the aforementioned non-volatile memory, the bottom width of each assist gate 202 is increased while the top width of each assist gate 202 is reduced and the bottom width of the floating gate 210 is reduced while the top width is increased. Hence, the memory cells can have greater better device reliability and performance and a higher operating speed without having to change the dimension of the memory cells.

In addition, the top of the floating gates 210 is higher than the top of the assist gates 202 in the aforementioned non-volatile memory. Moreover, the top of the floating gates 210 have sharp corners 210a. Thus, in the process of erasing data from the non-volatile memory, the corner regions 210a of the floating gates 210 can produce strong electric fields so that electrons can be rapidly channeled into their respective word lines 208 (the control gates). Hence, the time required to erase the data is shortened and the voltage applied to the word lines 208 (the control gates) can be reduced.

FIG. 2C is a simplified circuit diagram of the non-volatile memory for showing the operating mode of the non-volatile memory according to the present invention.

As shown in FIG. 2C, the non-volatile memory in the present invention includes, for example, six memory cells Q11~Q23, three assist gate lines AG1~AG3, two word lines WL1~WL2 and three source/drain lines DL1~DL3. Here, six memory cells are used in the illustration. Obviously, the number of memory cells in the non-volatile memory can change according to the actual requirements.

The six memory cells Q11~Q23 are aligned to form a 3×2 array. Each memory cell includes an assist gate, a control gate, a floating gate and a pair of source/drain regions. The memory cells Q11~Q13 are aligned to form a memory cell row and the memory cells Q21~Q23 are aligned to form another memory cell row. Adjacent memory cells in the same row share a source/drain region.

The assist gate lines AG1~AG3 are aligned in parallel in the column direction to connect with the assist gate of the memory cells in the same column. For example, the assist gate line AG1 connects the assist gate of the memory cells Q11 and Q21; the assist gate line AG2 connects the assist gate of the memory cells Q12 and Q22; and, the assist gate line AG3 connects the assist gate of the memory cells Q13 and Q23.

The source/drain lines DL1~DL3 are aligned in parallel in the column direction to connect the source/drain region of the memory cells in the same column.

The word lines WL1~WL2 connect with the control gate of the memory cells in the same row. For example, the control gate line WL1 connects the control gate of the memory cells Q11~Q13; and, the control gate line WL2 connects the control gate of the memory cells Q21~Q23.

In a programming operation, such as programming data into the memory cell Q22 as an example, a biased voltage of about 12V is applied to the selected word line WL2 and a biased voltage of about 0V is applied to non-selected word line WL1; a biased voltage of about 2V is applied to the selected assist gate line AG2 and a biased voltage of about 0V is applied to the non-selected assist gate lines AG1 and AG3; and, a biased voltage of about 5V is applied to the selected source/drain line DL3 and a biased voltage of about 0V is applied to the non-selected source/drain lines DL1 and DL2. Hence, channel hot electron injection (CHEI) effect is triggered to inject electrons into the floating gate of the memory cell and hence programmed the memory cell Q22.

To read data from the memory cell Q22, a biased voltage of about 3.3 is applied to the word line WL2, a biased voltage is of about 3.3V is applied to the assist gate line AG2 and a biased voltage of about 1V is applied to the source/drain line DL3. Because the channel is shut with the flow of a small current whenever the net electric charges within the floating gate of the memory cell is negative and the channel is open with the flow of a large current whenever the net electric charges within the floating gate of the memory cell is slightly positive, the channel open-shut/current large-small characteristics can be utilized to determine whether the digital value of stored inside the memory cell is a '1' or a '0'.

To erase data from the memory cell Q22, a biased voltage of about 16V is applied to the word line WL2 so that channel FN (Fowler-Nordheim) tunneling effect is activated to pull the electrons from the floating gate of the memory cell to the word line WL2. Hence, the data within the memory cell is erased.

Figure 3A:
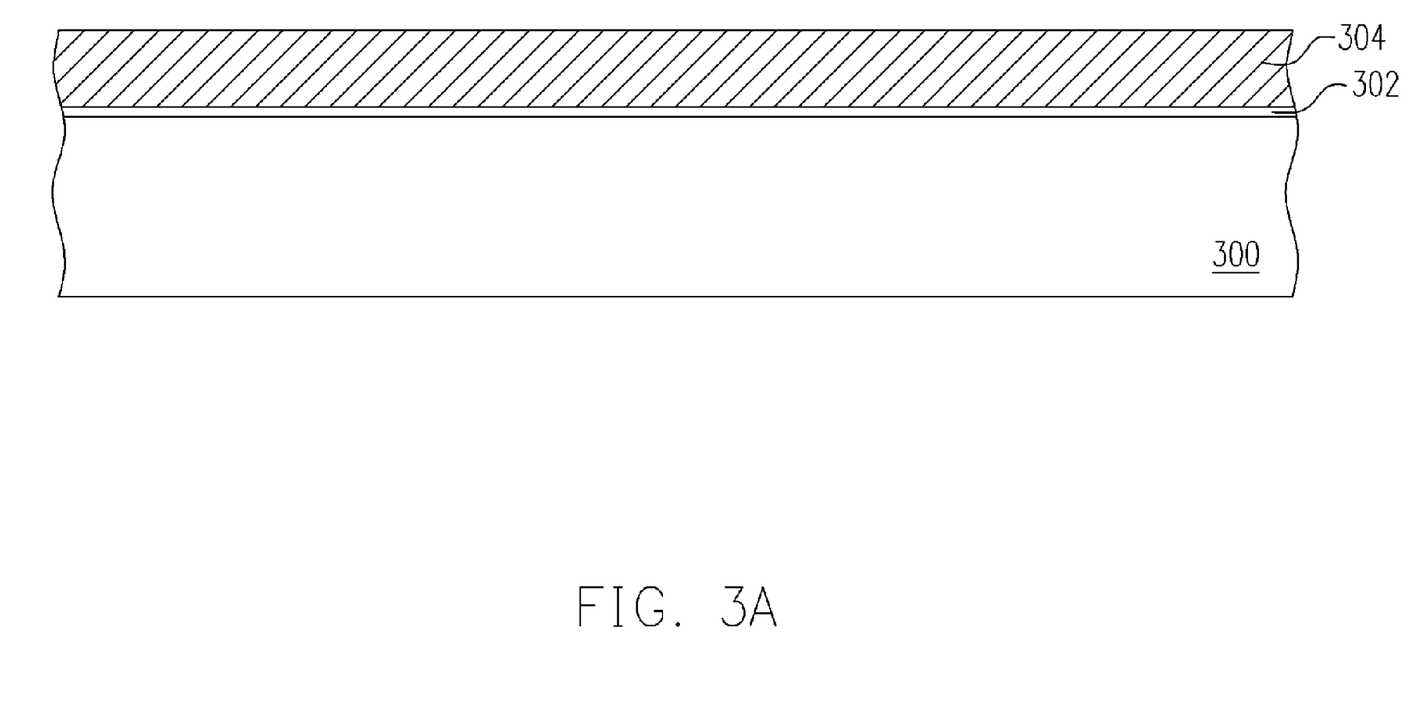
FIGS. 3A through 3F are schematic cross-sectional views showing the steps for fabricating a non-volatile memory according to the present invention.

FIGS. 3A through 3F are schematic cross-sectional views showing the steps for fabricating a non-volatile memory according to the present invention. In fact, FIGS. 3A through 3F are cross-sectional views along line A-A' of FIG. 2A. First, as shown in FIG. 3A, a substrate 300 is provided. The substrate 300 is a silicon substrate, for example. Then, a dielectric layer 302 and a conductive layer 304 are sequentially formed over the substrate 300. The dielectric layer 302 is a silicon oxide layer formed, for example, by performing a thermal oxidation process. The conductive layer 304 is a doped polysilicon layer, for example. The conductive layer 304 is formed by depositing undoped polysilicon over the substrate 300 to form an undoped polysilicon layer in a chemical vapor deposition and performing an ion implantation thereafter, for example.

Figure 3B:
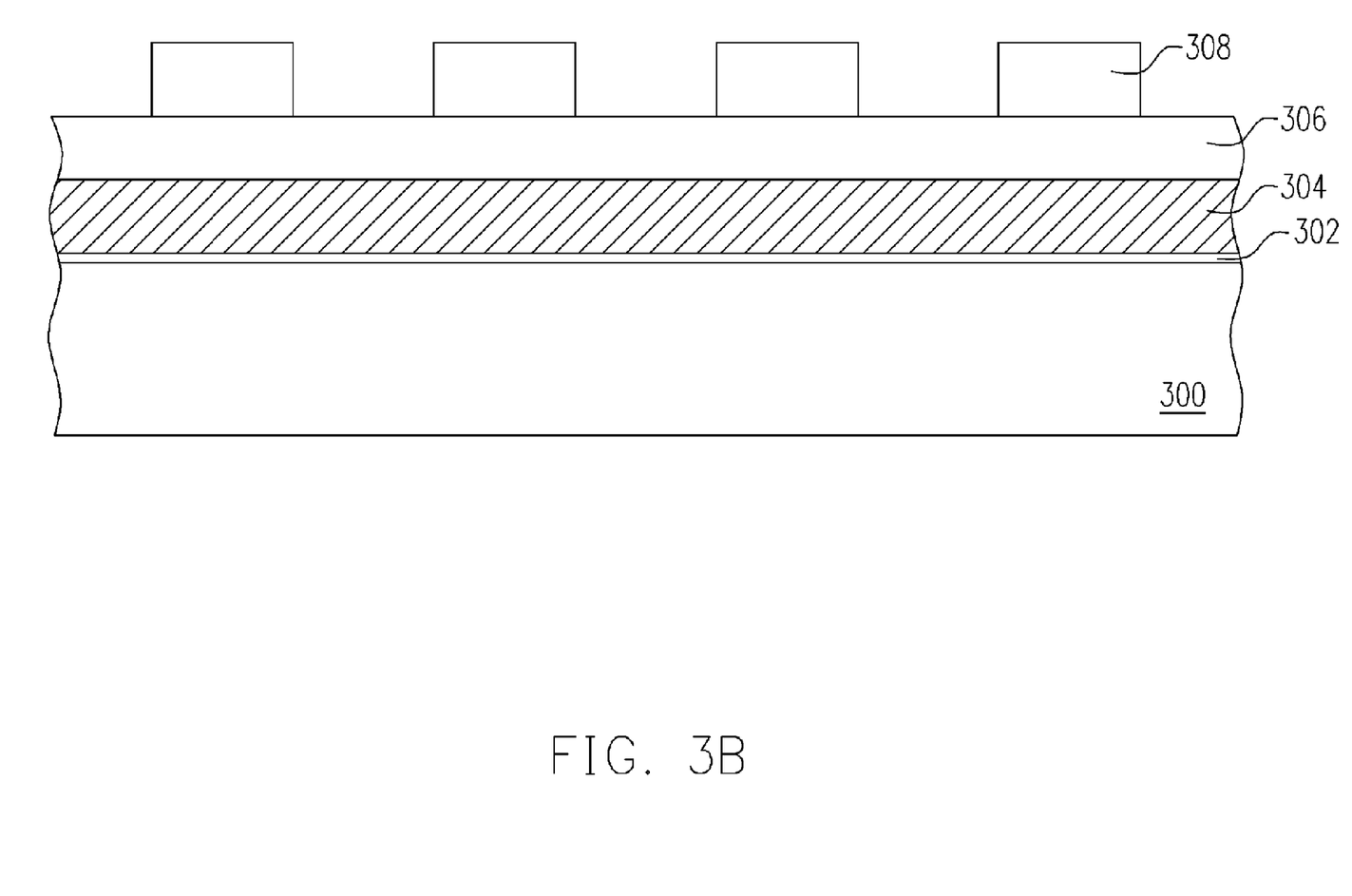

As shown in FIG. 3B, a cap layer 306 is formed over the conductive layer 304. The cap layer 306 is a silicon nitride layer formed, for example, by performing a chemical vapor deposition process. Thereafter, a patterned photoresist layer 308 is formed over the cap layer 306. The patterned photoresist layer 308 is formed, for example, by coating a photoresist material over the cap layer 306 in a spin-coating process and performing a photolithographic process thereafter.

Figure 3C:
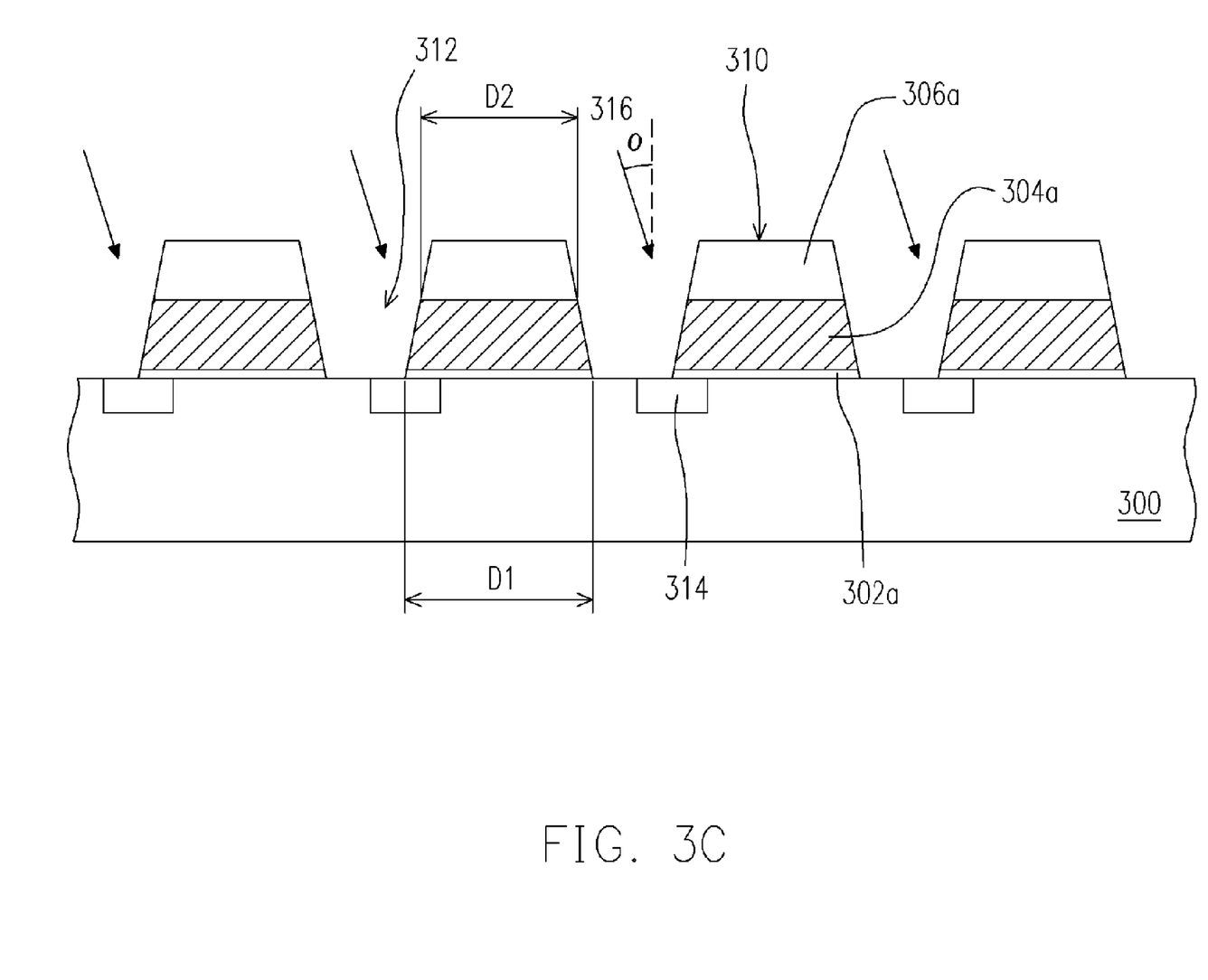

As shown in FIG. 3C, using the patterned photoresist layer 308 as a mask, a tilt etching process is performed to remove a portion of the cap layer 306, the conductive layer 304 and the dielectric layer 302 to form a plurality of assist gate structures 310. The assist gate structures 310 are separated from each other by a gap 312. Each assist gate structure 310 includes a gate dielectric layer 302a, an assist gate 304a and a cap layer 306a. The bottom portion of the assist gate 304a has a width D1 and the top portion of the assist gate 304a has a width D2, for example. The bottom width D1 is greater than the top width D2. In other words, the assist gate structure 310 has a cross-section shaped like a trapezium.

After removing the patterned photoresist layer 308, a plurality of source/drain regions 314 is formed in the substrate 300 on one side of the assist gate structure 310. The source/drain regions 314 are formed, for example, by performing a tilted ion implantation. In the tilted ion implantation, the included angle θ between the ion implant direction 316 and the direction perpendicular to the top surface of the substrate 300 can be adjusted according to a particular processing requirement.

Figure 3D:
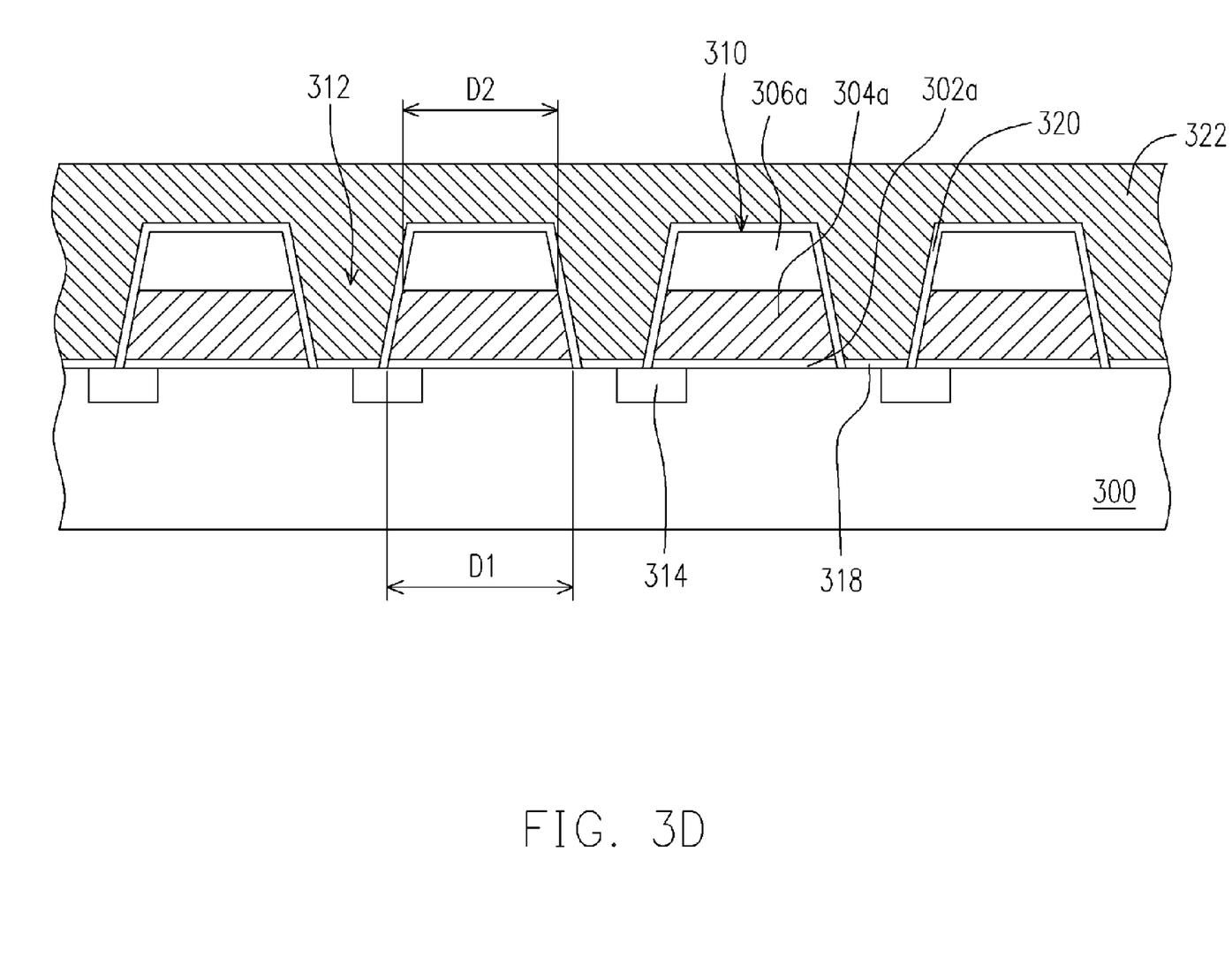

As shown in FIG. 3D, a tunneling dielectric layer 318 and an inter-gate dielectric layer 320 are sequentially formed over the substrate 300. The tunneling dielectric layer 318 and the inter-gate dielectric layer 320 are fabricated using silicon oxide and formed by performing a chemical vapor deposition process, for example. Obviously, the tunneling dielectric layer 318 and the inter-gate dielectric layer 320 can also be fabricated by performing a thermal oxidation process. Thereafter, a conductive material layer 322 is formed over the substrate 300. The conductive material layer 322 completely fills the gaps 312 between various assist gate structures 310. The conductive material layer 322 is fabricated using doped polysilicon, for example. The method of forming the conductive material layer 322 includes depositing undoped polysilicon over the substrate 300 in a chemical vapor deposition and implanting ions into the undoped polysilicon layer thereafter.

Figure 3E:
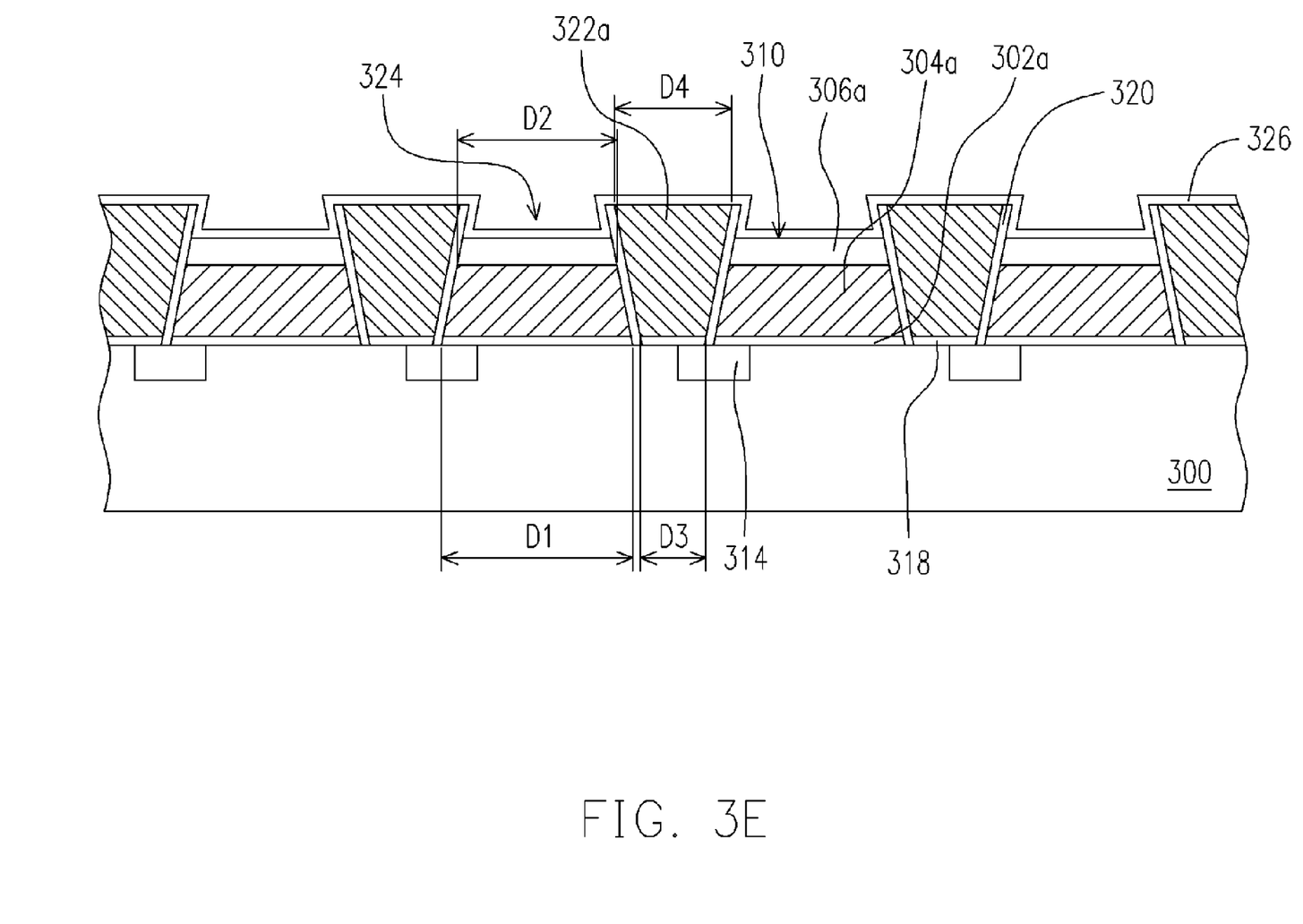

As shown in FIG. 3E, a portion of the conductive material layer 322 is removed until the cap layer 306a is exposed so that linear strips 322a parallel to the assist gate structures 310 is formed between the assist gate structures 310. The method of removing a portion of the conductive material layer 322 includes performing a chemical-mechanical polishing. Obviously, the conductive material layer 322 can be removed by performing an etching back operation. The bottom portion of the conductive layer 322a between the assist gate structures 310 has a width D3 and the top portion of the conductive layer 322a has a width D4 such that the top width D4 is greater than the bottom width D3. In other words, the conductive layer 322a has a cross-section shaped like an inverted trapezium.

Thereafter, a portion of the cap layer 306a is removed so that the top surface of the cap layer 306a is below the top surface of the conductive layer 322a and a plurality of openings 324 is formed between the conductive layers 322a. The method of removing a portion of the cap layer 306a includes, for example, performing a wet etching or dry etching process. When the cap layer 306a is fabricated using silicon nitride and a wet etching operation is used to remove a portion of the cap layer 306a, hot phosphoric acid can be used as the etchant.

After that, an inter-gate dielectric layer 326 is formed over the substrate 300. The inter-gate dielectric layer 326 can be a silicon oxide layer, for example. Obviously, the inter-gate dielectric layer 326 can be an oxide/nitride/oxide or an oxide/nitride composite layer. The inter-gate dielectric layer 326 is formed, for example, by performing a chemical vapor deposition process.

Figure 3F:
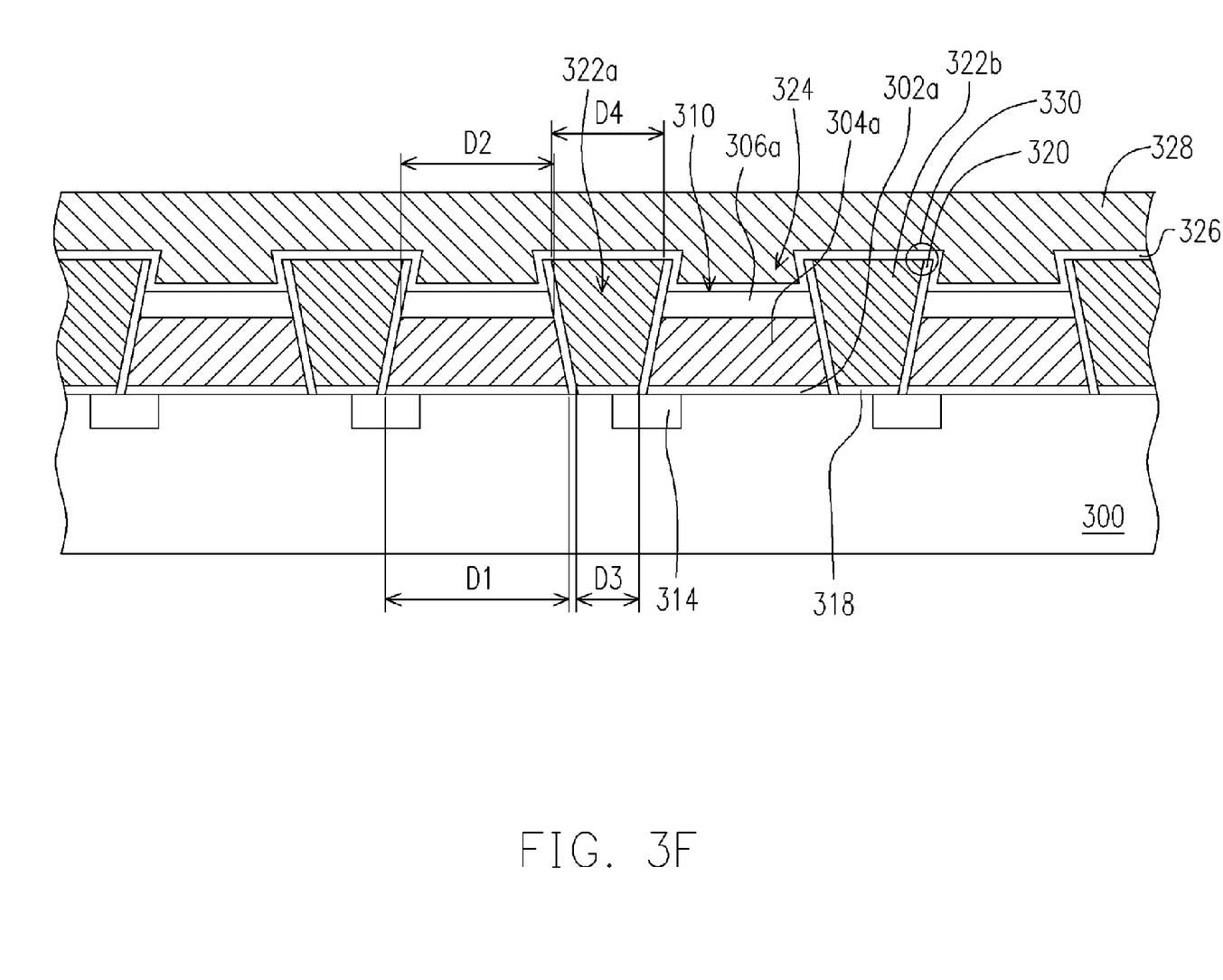

As shown in FIG. 3F, a conductive layer (not shown) is formed over the substrate 300 to fill the openings 324 between the conductive layers 322a completely. The steps for forming the conductive layer includes, for example, depositing conductive material over the substrate 300 and planarizing the conductive material layer by performing a chemical-mechanical polishing or an etching back operation. The conductive layer is a doped polysilicon fabricated, for example, by depositing undoped polysilicon in a chemical vapor deposition and implanting ions into the undoped polysilicon layer thereafter. Thereafter, the conductive layer, the inter-gate dielectric layer 326 and the conductive layers 322a are patterned to form a word line 328 (a control gate) and a plurality of floating gates 322b. Because the top portion of the floating gates 322b are higher than the top portion of the assist gates 304a and the top portion of the floating gates 322b has sharp corners 330, a strong electric field is produced around the corner regions 330 of the floating gates 322b. Consequently, electrons are rapidly channeled into the word line 328 (the control gate) through the sharp corners 330. Hence, the time required to erase data from the memory is shortened and the voltage applied to the word line 328 (the control gate) is reduced. After that, other steps needed to form the memory array are performed. Since these subsequent steps should be familiar to those skilled in these techniques, a detailed description is omitted.

In the aforementioned method of fabricating the non-volatile memory, the step of forming the word line 328 (the control gate) also includes cutting the linear conductive layers 322a and forming a plurality of block-shaped floating gates 322b (labeled 210 in FIG. 2A). Thus, the processing needed to form the non-volatile memory is very much simplified. Furthermore, the conductive layers 322a is formed by depositing conductive material to form a conductive material layer and performing a chemical-mechanical polishing to remove the conductive material layer outside the gaps 312. Therefore, there is no need to perform any photolithographic and etching process and hence the processing step is further simplified.

In the aforementioned method of fabricating the non-volatile memory, a tilt etching process is performed to produce assist gates 304a having a bottom width D1 greater than the top width D2 so that the channel underneath the assist gates 304a is longer. Thus, the disturbance between adjacent memory cells when the memory cell is programmed is minimized. Furthermore, the way the gaps 312 are filled produces floating gates 322b having a top width D4 greater than the bottom width D3. Therefore, the overlapping area between the word line 326 (the control gate) and the floating gate 322b and hence the gate-coupling ratio of the memory cell is increased. As a result, the voltage need to operate the memory cells is reduced.

All in all, the non-volatile memory fabricated according to the method of the present invention is able to produce a memory cell with greater device reliability, operating speed and electrical performance without changing the intrinsic dimension of each memory cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a substrate;
   an assist gate disposed on the substrate, wherein the bottom portion of the assist gate has a first width and the top portion of the assist gate has a second width, and the first width is greater than the second width;
   a gate dielectric layer disposed between the assist gate and the substrate;
   a word line disposed on the substrate;
   a floating gate disposed on one side of the assist gate and located between the word line and the substrate, wherein the bottom portion of the floating gate has a third width and the top portion of the floating gate has a fourth width, the fourth width is greater than the third width, and the assist gate, the floating gate and the word line together form a memory unit;
   a tunneling dielectric layer disposed between the floating gate and the substrate;
   an inter-gate dielectric layer disposed between the word line and the floating gate, between the word line and the assist gate and between the assist gate and the floating gate; and
   a source/drain region disposed in the substrate on the respective sides of the memory unit.

2. The non-volatile memory of claim 1, wherein the top portion of the floating gate is higher than the top portion of the assist gate and the top portion of the floating gate also has a sharp corner.

3. The non-volatile memory of claim 1, wherein the memory further comprises a cap layer disposed between the assist gate and the word line.

4. The non-volatile memory of claim 1, wherein the first width at the bottom of the assist gate is greater than the third width at the bottom of the floating gate.

5. A non-volatile memory, comprising:
   a substrate;
   a plurality of assist gates aligned in parallel on the substrate, wherein the bottom portion of each assist gate has a first width and the top portion of each assist gate has a second width, and the first width is greater than the second width;
   a plurality of gate dielectric layers disposed between the respective assist gates and the substrate;
   a plurality of word lines aligned in parallel on the substrate, wherein the word lines cross over the assist gates;
   a plurality of floating gates disposed between various assist gates and located between the word lines and the substrate, wherein the bottom portion of each floating gate has a third width and the top portion of each floating gate has a fourth width, and the fourth width is greater than the third width;
   a plurality of tunneling dielectric layers disposed between the respective floating gate and the substrate;
   a plurality of inter-gate dielectric layers disposed between the respective word lines and the substrate, between the respective word lines and the assist gates and between the respective assist gates and the floating gates; and
   a plurality of source/drain regions disposed in the substrate on one side of the respective assist gates.

6. The non-volatile memory of claim 5, wherein the top portion of the floating gates are higher than the top portion of the assist gates and the top portion of each floating gates has at least a sharp corner.

7. The non-volatile memory of claim 5, wherein the memory further comprises a plurality of cap layers disposed between the respective assist gates and the word lines.

8. The non-volatile memory of claim 5, wherein the first width at the bottom portion of the assist gates is greater than the third width at the bottom of the floating gates.

* * * * *